(12) United States Patent
Campbell et al.

(10) Patent No.: US 7,272,005 B2
(45) Date of Patent: Sep. 18, 2007

(54) MULTI-ELEMENT HEAT EXCHANGE ASSEMBLIES AND METHODS OF FABRICATION FOR A COOLING SYSTEM

(75) Inventors: Levi A. Campbell, New Paltz, NY (US); Richard C. Chu, Hopewell Junction, NY (US); Michael J. Ellsworth, Jr., Lagrangeville, NY (US); Madhusudan K. Iyengar, Kingston, NY (US); Roger R. Schmidt, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 111 days.

(21) Appl. No.: 11/290,757

(22) Filed: Nov. 30, 2005

(65) Prior Publication Data

US 2007/0121294 A1    May 31, 2007

(51) Int. Cl.
  *H05K 7/20*    (2006.01)
(52) U.S. Cl. ............... 361/699; 165/80.4; 165/165; 165/166; 422/224; 174/15.1; 174/259; 257/714
(58) Field of Classification Search .......... 361/699, 361/700, 690, 702, 689, 687; 165/165, 166, 165/80.4, 145, 170, 10, 82, 104.33, 167; 165/185; 257/714; 174/15.1, 259
See application file for complete search history.

(56) References Cited

U.S. PATENT DOCUMENTS

| | | | | |
|---|---|---|---|---|
| 4,858,685 A | * | 8/1989 | Szucs et al. ............... | 165/166 |
| 5,088,552 A | * | 2/1992 | Raunio ....................... | 165/166 |
| 5,228,515 A | | 7/1993 | Tran ........................... | 165/166 |
| 5,845,399 A | * | 12/1998 | Dewar et al. ............ | 29/890.03 |
| 6,059,023 A | * | 5/2000 | Kurematsu .................. | 165/165 |
| 6,125,926 A | * | 10/2000 | Okamoto et al. ........... | 165/166 |

(Continued)

OTHER PUBLICATIONS

"Miniature Heat Exchanger for Corrosive Media," IBM Technical Disclosure Bulletin, vol. 38, No. 01 (pp. 55-56) (Jan. 1995).

(Continued)

*Primary Examiner*—Boris Chervinsky
*Assistant Examiner*—Courtney Smith
(74) *Attorney, Agent, or Firm*—Lily Neff, Esq.; Kevin P. Radigan, Esq.; Heslin Rothenberg Farley & Mesiti, P.C.

(57) ABSTRACT

A heat exchange assembly for a cooling system, having first and second cooling loops, includes a housing with a first coolant inlet and outlet and a second coolant inlet and outlet, respectively coupling to the first and second cooling loops, and multiple heat exchange elements. Each heat exchange element includes a first set and a second set of coolant flow passages intersecting different pairs of parallel face surfaces of the elements, with the second set of flow passages extending in a transverse direction to the first set of flow passages. The heat exchange elements are disposed within the housing with the first set of flow passages oriented in a first common direction in fluid communication with the first coolant inlet and outlet and the second set of flow passages oriented in a second common direction in fluid communication with the second coolant inlet and outlet of the housing.

20 Claims, 12 Drawing Sheets

U.S. PATENT DOCUMENTS

| | | | |
|---|---|---|---|
| 6,459,581 B1 * | 10/2002 | Newton et al. | 361/700 |
| 6,675,875 B1 | 1/2004 | Vafai et al. | 165/80.4 |
| 6,840,308 B2 * | 1/2005 | Ritter et al. | 165/80.4 |
| 6,840,313 B2 | 1/2005 | Abiko et al. | 165/166 |
| 6,910,528 B2 * | 6/2005 | Abiko et al. | 165/166 |
| 6,986,382 B2 * | 1/2006 | Upadhya et al. | 165/80.4 |
| 7,004,237 B2 * | 2/2006 | Mathur et al. | 165/82 |
| 7,104,312 B2 * | 9/2006 | Goodson et al. | 165/80.4 |
| 7,104,315 B2 * | 9/2006 | Blomgren | 165/165 |
| 2002/0125001 A1 | 9/2002 | Kelly et al. | 165/165 |
| 2006/0096746 A1 * | 5/2006 | Arpin et al. | 165/166 |
| 2006/0165570 A1 * | 7/2006 | Knopf et al. | 422/224 |

OTHER PUBLICATIONS

C.M. Berger, et al., "Crossflow Heat Exchanger," IBM Technical Disclosure Bulletin, vol. 13, No. 10, (p. 3011) (Mar. 1971).

"Highly Parallel Flow to Reduce Hydraulic Resistance of Heat Exchangers," IBM Technical Disclosure Bulletin, vol. 35, No. 6, (pp. 335-338) (Nov. 1992).

Campbell, et al., "Cooling System and Method Employing a Closed Loop Coolant Patent and Micro-Scaled Cooling Structure Within an Electronics Subsystem of an Electronics Rack," U.S. Appl. No. 11/008,711, filed Dec. 9, 2004.

Campbell et al., "Cooling Apparatus and Method for an Electronics Module Employing an Integrated Heat Exchange Assembly," U.S. Appl. No. 11/008,359, filed Dec. 9, 2004.

Campbell et al., "Cooling Apparatus for an Electronics Subsystem Employing a Coolant Flow Drive Apparatus Between Coolant Flow Paths," U.S. Appl. No. 11/008,732, filed Dec. 9, 2004.

Colgan et al., "Apparatus and Methods for Microchannel Cooling of Semiconductor Integrated Circuit Packages," U.S. Appl. No. 10/883,534, filed Jul. 1, 2004.

* cited by examiner

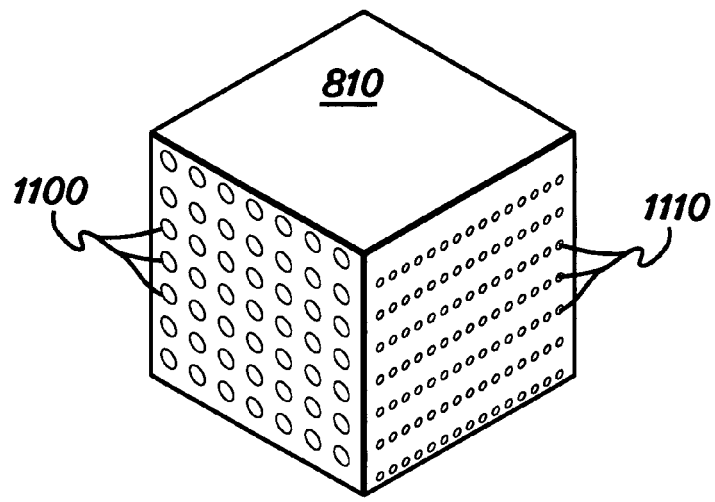
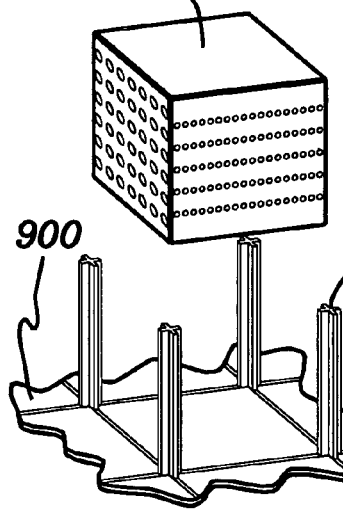
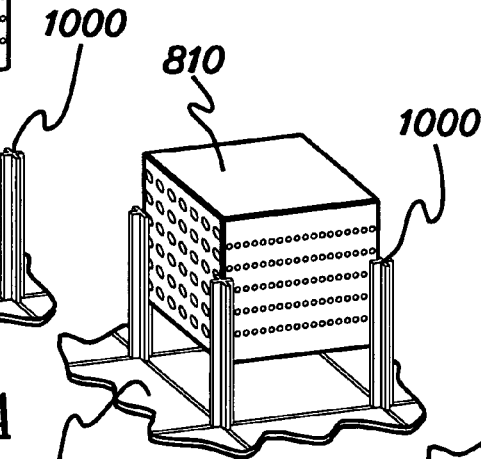
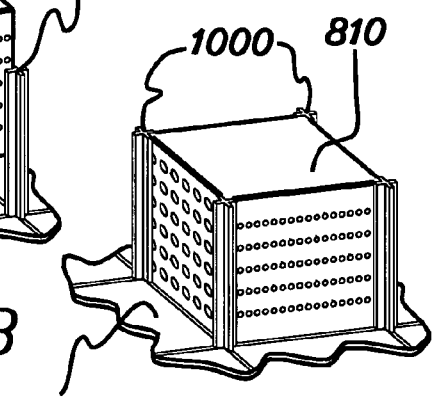
fig. 11
fig. 12A
fig. 12B
fig. 12C

MULTI-ELEMENT HEAT EXCHANGE ASSEMBLIES AND METHODS OF FABRICATION FOR A COOLING SYSTEM

CROSS-REFERENCE TO RELATED APPLICATIONS

This application contains subject matter which is related to the subject matter of the following patent applications, each of which is assigned to the same assignee as this application and each of which is hereby incorporated herein by reference in its entirety:

"Cooling Apparatus And Method For An Electronics Module Employing An Integrated Heat Exchange Assembly," Campbell et al., Ser. No. 11/008,359, filed Dec. 9, 2004;

"Cooling Apparatus For An Electronics Subsystem Employing A Coolant Flow Drive Apparatus Between Coolant Flow Paths," Campbell et al., Ser. No. 11/008,732, filed Dec. 9, 2004; and "Cooling System And Method Employing A Closed Loop Coolant Path And Micro-Scaled Cooling Structure Within An Electronics Subsystem Of An Electronics Rack," Campbell et al., Ser. No. 11/008,771, filed Dec. 9, 2004.

TECHNICAL FIELD

The present invention is directed to cooling assemblies and other apparatus used for removing heat from electronics devices, modules and systems. More particularly, this invention relates to an enhanced heat exchange assembly, cooling system and method for extracting heat from heat generating components of one or more electronics subsystems of one or more electronics racks.

BACKGROUND OF THE INVENTION

As is well known, as the circuit density of electronic chip devices increases in order to achieve faster and faster processing speed, there is a correspondingly increasing demand for the removal of heat generated by these devices. The increased heat demand arises both because the circuit devices are packed more closely together and because the circuits themselves are operated at increasingly higher clock frequencies. Nonetheless, it is also known that runaway thermal conditions and excessive heat generated by chips is a leading cause of failure of chip devices. Furthermore, it is anticipated that demand for heat removal from these devices will increase indefinitely. Accordingly, it is seen that there is a large and significant need to provide useful cooling mechanisms for electronic circuit devices.

Each new generation of computers continues to offer increased speed and function. In most cases, this has been accomplished by a combination of increased power dissipation and increased packaging density. The net result has been increased heat flux at all levels of packaging. For example, a common packaging configuration for many large computer systems today is a multi-drawer rack, with each drawer containing one or more processor modules along with associated electronics, such as memory, power and hard drive devices. These drawers are removable units so that in the event of failure of an individual drawer, the drawer may be removed and replaced in the field. The problem with this configuration is that the increase in heat flux at the electronics drawer level makes it increasingly difficult to dissipate heat by simple air cooling.

SUMMARY OF THE INVENTION

The shortcomings of the prior art are overcome and additional advantages are provided through a heat exchange assembly for a cooling system having a first cooling loop and a second cooling loop. The heat exchange assembly includes a housing and multiple heat exchange elements disposed within the housing. The housing includes a first coolant inlet, a first coolant outlet, a second coolant inlet, and a second coolant outlet, with the first coolant inlet and the first coolant outlet being designed to couple in fluid communication with the first cooling loop, and the second coolant inlet and the second coolant outlet being designed to couple in fluid communication with the second cooling loop. Each heat exchange element includes a structure with a first set of coolant flow passages defined therein intersecting a first pair of parallel face surfaces of the structure and a second set of coolant flow passages defined therein intersecting a second pair of parallel face surfaces of the structure. The second set of coolant flow passages are disposed to extend in a transverse direction to the first set of coolant flow passages, and the heat exchange elements are positioned within the housing with the first set of coolant flow passages thereof oriented in a first common direction between the first coolant inlet and the first coolant outlet of the housing, and the second set of coolant flow passages thereof oriented in a second common direction in fluid communication with the second coolant inlet and the second coolant outlet of the housing.

In another aspect, a cooled electronics system is provided which includes at least one electronics rack having a plurality of electronics subsystems, and a cooling system for at least one electronics subsystem of the plurality of electronics subsystems. The cooling system includes a first cooling loop and a second cooling loop coupled by a heat exchange assembly. The heat exchange assembly includes a housing and multiple heat exchange elements disposed therein. The housing has a first coolant inlet and outlet, and a second cooling inlet and outlet. The first coolant inlet and outlet are coupled in fluid communication to the first cooling loop, while the second coolant inlet and outlet are coupled in fluid communication to the second cooling loop. Each heat exchange element is a structure with a first set of coolant flow passages defined therein intersecting a first pair of parallel face surfaces of the structure, and a second set of coolant flow passages defined therein intersecting a second pair of parallel face surfaces of the structure, wherein the second set of coolant flow passages extend in a transverse direction to the first set of coolant flow passages, and wherein the heat exchange elements are disposed within the housing with the first set of coolant flow passages thereof oriented in a first common direction in fluid communication with the first coolant inlet and the first coolant outlet of the housing, and the second set of coolant flow passages thereof oriented in a second common direction in fluid communication with the second coolant inlet and the second coolant outlet of the housing.

In a further aspect, a method is provided for fabricating a heat exchange assembly for a cooling system having a first cooling loop and a second cooling loop. The method includes: providing a housing having a first coolant inlet, a first coolant outlet, a second coolant inlet and a second coolant outlet, the first coolant inlet and the first coolant outlet being provided for fluid communication with the first cooling loop, and the second coolant inlet and the second coolant outlet being provided for fluid communication with the second cooling loop; and disposing multiple heat exchange elements within the housing, each heat exchange element including a structure with a first set of coolant flow passages defined therein intersecting a first pair of parallel face surfaces of the structure and a second set of coolant flow passages defined therein intersecting a second pair of parallel face surfaces of the structure, wherein the second set of coolant flow passages extend in a transverse direction to the first set of coolant flow passages, and wherein the heat exchange elements are disposed within the housing with the first set of coolant flow passages thereof oriented in a first common direction between the first coolant inlet and the first coolant outlet of the housing, and the second set of coolant flow passages thereof oriented in a second common direction between the second coolant inlet and the second coolant outlet of the housing.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 11 is an isometric view of one embodiment of a heat exchange element for a heat exchange assembly, in accordance with an aspect of the present invention;

FIG. 12A is an isometric view of one embodiment of one heat exchange element, such as depicted in FIG. 11, shown disposed above a heat exchange element receiving space defined in the base housing between four positioning pins, in accordance with an aspect of the present invention;

FIG. 12B is an isometric view of the structures of FIG. 12A, showing the heat exchange element being placed into the heat exchange element receiving space defined by the illustrated positioning pins, in accordance with an aspect of the present invention;

FIG. 12C is an isometric view of the heat exchange element and base housing of FIGS. 12A & 12B, showing the heat exchange element disposed between the positioning pins projecting from the inner surface of the base housing, in accordance with an aspect of the present invention;

BEST MODE FOR CARRYING OUT THE INVENTION

As used herein, "electronics subsystem" comprises any housing, compartment, drawer, blade, etc., containing one or more heat generating components of a computer system or other electronics system requiring cooling. The term "electronics rack" includes any frame, rack, blade server system, etc., having a heat generating component of a computer system or electronics system, and may be, for example, a stand alone computer processor having high, mid or low end processing capability. In one embodiment, an electronics rack may comprise multiple electronics subsystems, each having one or more heat generating components requiring cooling. Each heat generating component may comprise an electronics device, an electronics module, an integrated circuit chip, etc. As used herein, "micro-scaled cooling structure" means a cooling structure with a characteristic dimension of 200 microns or less.

One example of coolant within a cooling system in accordance with an aspect of the present invention is water. However, the concepts disclosed herein are readily adapted to use with other types of coolant on the facility side, system side, and conditioned coolant side of the cooling system. For example, one or more of the coolants may comprise a brine, a fluorocarbon liquid, a liquid metal, or other similar coolant, or a refrigerant, while still maintaining the advantages and unique features of the present invention.

As noted briefly above, power levels in computer equipment (primarily processors) are again rising to a level where they no longer can be simply air cooled. The components will likely be water cooled. Heat dissipated by the processor can be transferred to water via a water cooled cold plate. Facility water typically available at customer locations (i.e., data centers) is not suitable for use in these cold plates. First, condensation formation is a concern as the temperature of the data center water, ranging from 7° C. to 15° C., is far below the room dew point (typically 18-23° C.). Second, the relatively poor quality of the facility water (in chemistry, cleanliness, etc.) impacts system reliability. It is therefore desirable to utilize a water cooling/conditioning unit that circulates higher quality water to/from the electronics subsystems and rejects the heat to the data center water. As used herein, "facility water" or "facility coolant" refers to, in one example, this data center water or coolant, while "system coolant" refers to cooled/conditioned coolant circulating between a coolant distribution unit and the electronics subsystems to be cooled, and "conditioned coolant" refers to coolant circulating within a given electronics subsystem.

Figure 1:
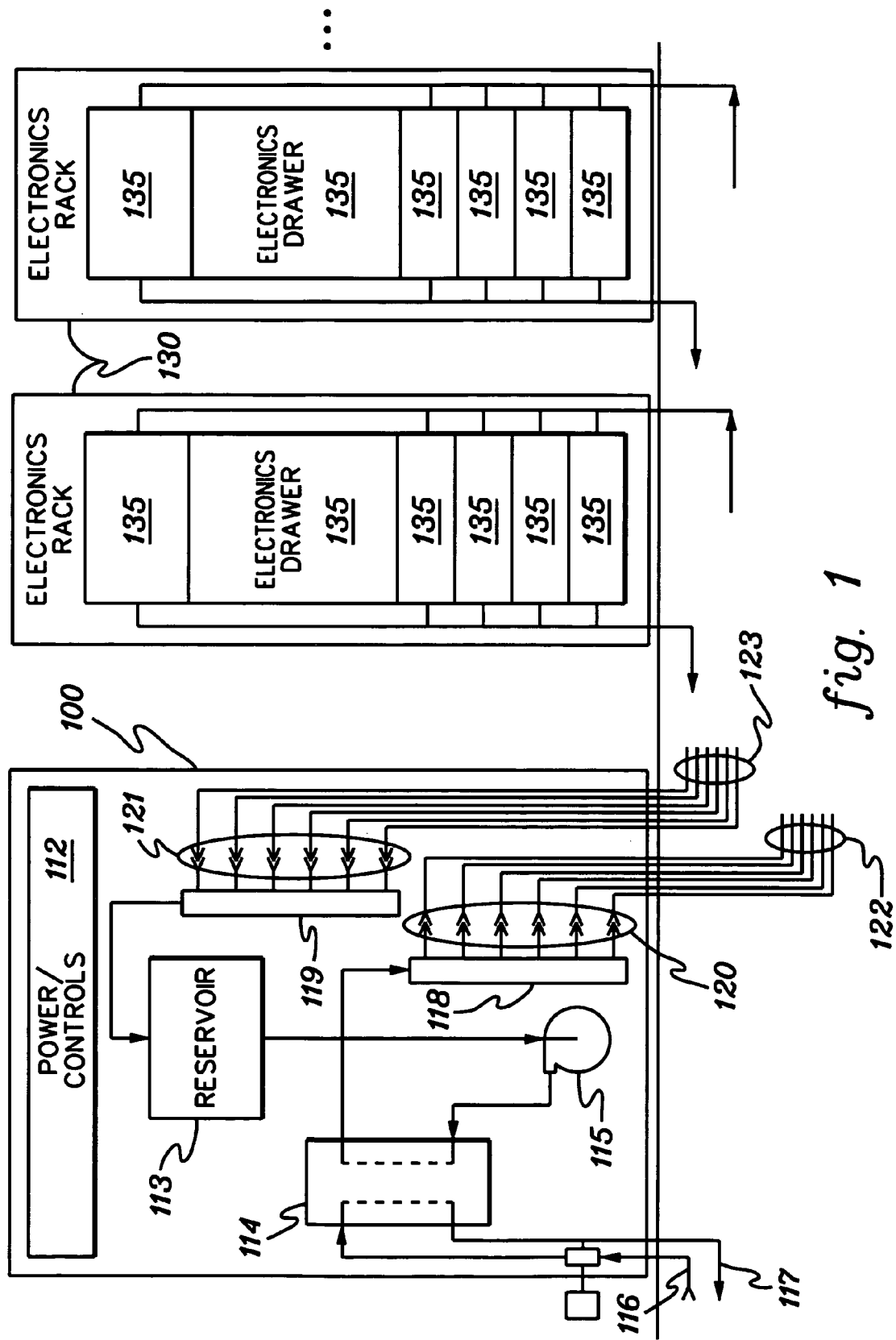
FIG. 1 depicts a conventional coolant distribution unit, such as a computer room water conditioning unit (CRWCU), for cooling one or more electronics racks of a computing environment.

Reference is now made to the drawings, wherein the same reference numbers used throughout different figures designate the same or similar components. FIG. 1 depicts one embodiment of a coolant distribution unit 100 for a computer room. The coolant distribution unit is conventionally a relatively large unit which occupies more space than an electronics frame. Within the cooling unit 100 is a power/control element 112, a reservoir/expansion tank 113, a heat exchanger 114, a pump 115 (often accompanied by a redundant second pump), facility water (or site or customer service water or coolant) inlet 116 and outlet 117 supply pipes, a supply manifold 118 directing water to the electronics frames 130 via couplings 120 and lines 122, and a return manifold 119 directing water from the electronics frames 130, via lines 123 and couplings 121. Each electronics rack includes multiple electronics drawers or multiple electronics subsystems 135.

Figure 2:
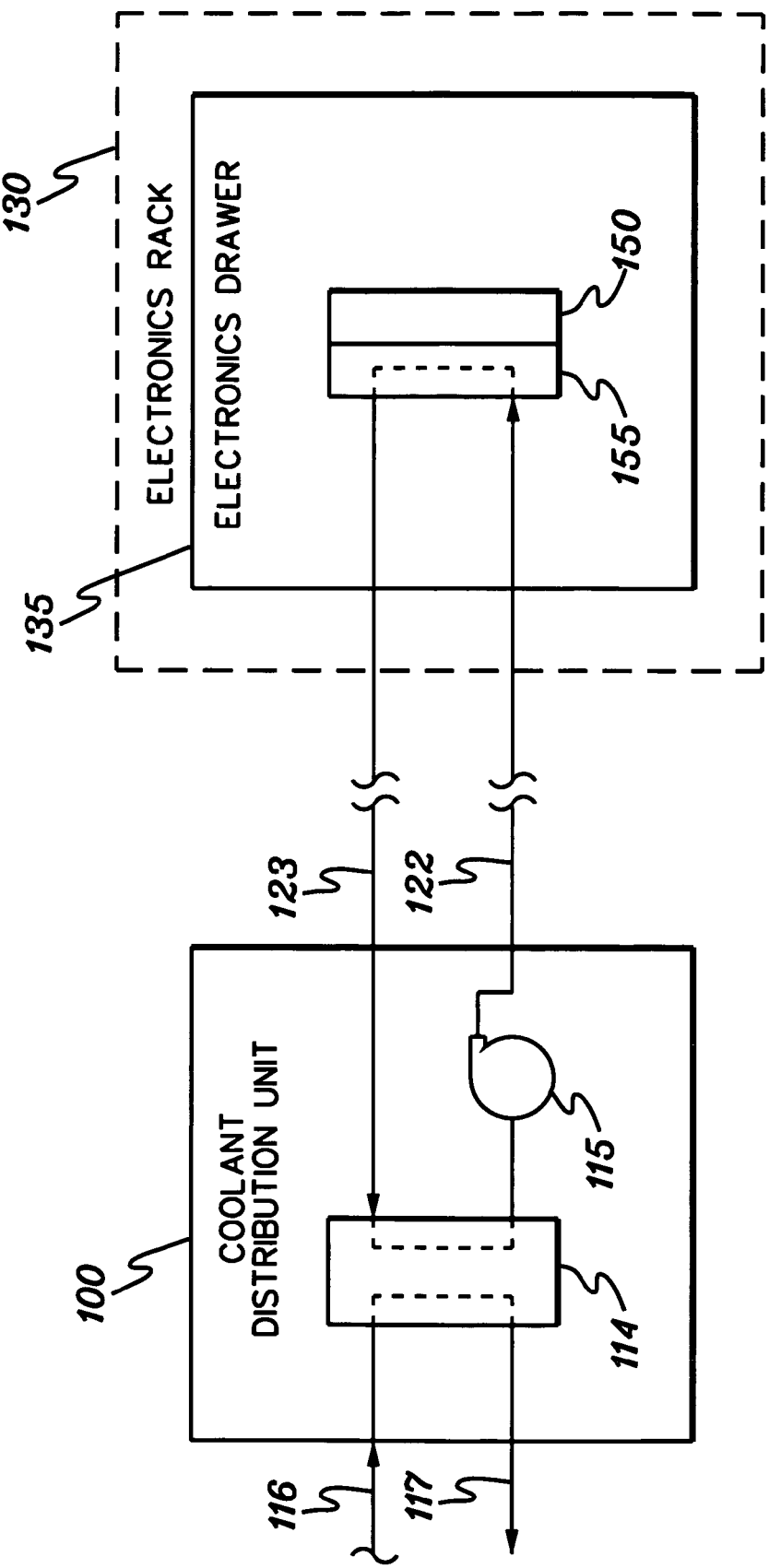
FIG. 2 is a schematic of one embodiment of an electronics drawer of an electronics rack and a cooling system therefor employing a conventional coolant distribution unit with a facility coolant loop and a system coolant loop.

FIG. 2 schematically illustrates operation of the cooling system of FIG. 1, wherein a liquid cooled cold plate 155 is shown coupled to an electronics module 150 of electronics drawer 135 within electronics rack 130. Heat is removed from electronics module 150 via the system coolant circulated via pump 115 through cold plate 155 within the system coolant loop defined by heat exchanger 114 of coolant distribution unit 100, lines 122, 123 and cold plate 155. The system coolant loop and coolant distribution unit are designed to provide coolant of a controlled temperature and pressure, as well as controlled chemistry and cleanliness to the electronics. Furthermore, the system coolant is physically separate from the less controlled facility coolant in lines 116, 117 to which heat is ultimately transferred to. Filtration has not been required in a system such as depicted in FIG. 2 since the system coolant loop has characteristic dimensions for fluid flow that are sufficiently large to allow residual particulate debris to flow freely through the loop. For example, a cold plate with 1.65 mm wide channels was employed in the ES/9000 system offered by International Business Machines Corporation of Armonk, N.Y.

As noted, processor power levels continue to rise as designers push for ever increasing computing performance. Electronic module power levels are expected to go well beyond conventional air cooling technologies, and even beyond conventional liquid cooling cold plate concepts. To address these future cooling needs, micro-scaled cooling structures are being developed. Two examples of such structures are marketed by Mikros Manufacturing, Inc., of Claremont, N.H., and ATOTECH of Berlin, Germany. Other examples of micro-scaled cooling structures are also available in the art. These micro-scaled cooling structures have a characteristic dimension more than an order of magnitude less than the cold plates previously employed. Further, the micro-scaled structures have a minimum dimension on the order of or smaller than particulates that regularly circulate through the system coolant of a cooling system such as depicted in FIGS. 1 & 2. In available micro-scaled structures, the characteristic dimension currently ranges from 50 to 100 micrometers (microns), and could be further reduced as the technology matures. At these small width scales, liquid cleanliness is imperative. At such dimensions, the micro-scaled cooling structure could act more like a filter than a heat sink, thereby inhibiting cooling.

One solution to the problem would be to introduce a filter into the system coolant side of the cooling assembly of FIGS. 1 & 2. This, unfortunately, would be undesirable because it would add additional pressure drop and would require continuing maintenance. Thus, in one aspect, an objective of the present invention is to create an isolated subassembly associated with the electronics subsystem which is in thermal contact with the system coolant loop and which is designed and manufactured to accommodate the micro-scale aspects of a micro-scaled cooling structure such as described above.

Figure 3:
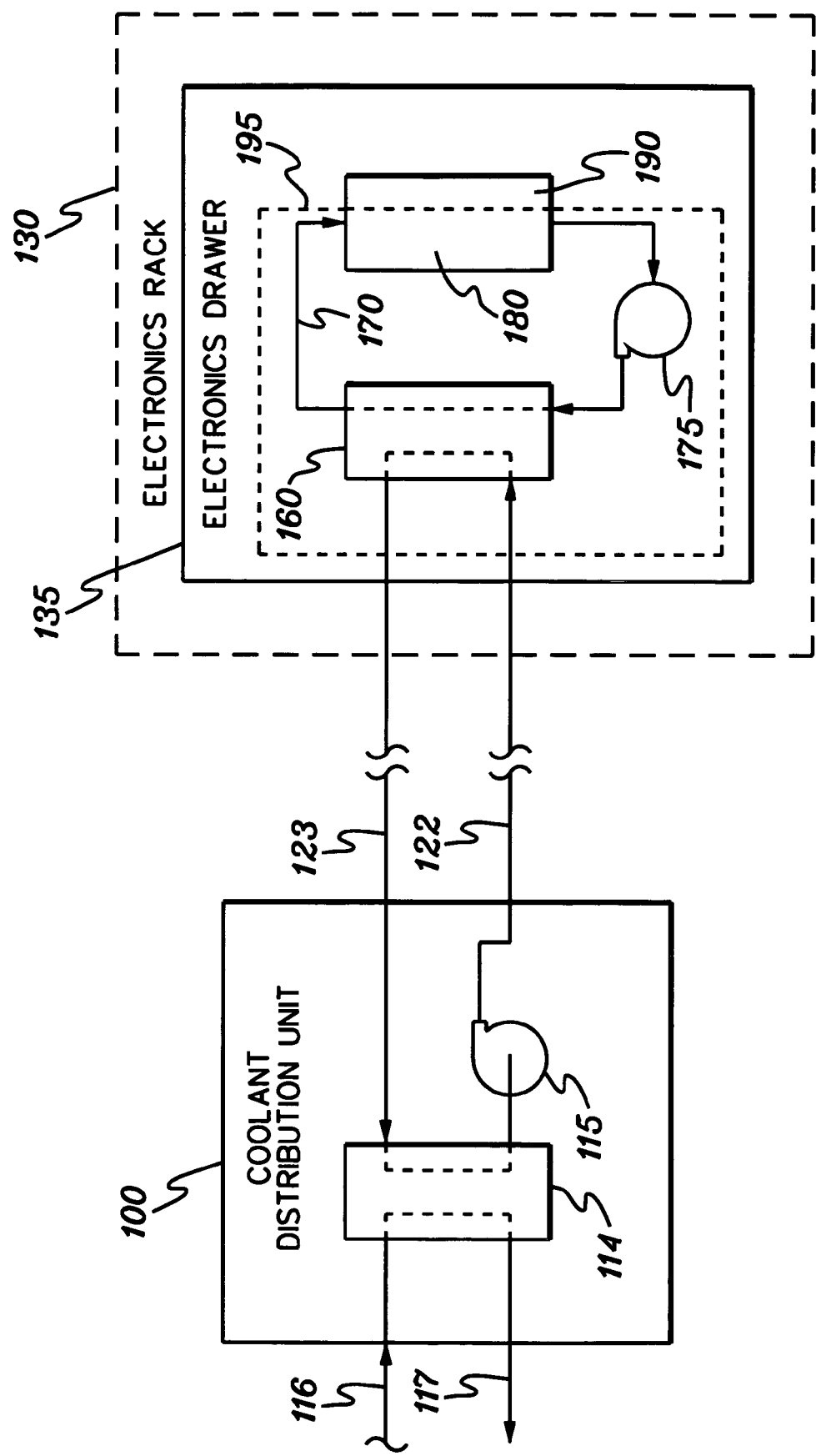
FIG. 3 is a schematic of one embodiment of a cooling system for an electronics subsystem of an electronics rack, which includes a coolant distribution unit and a thermal dissipation unit comprising a conditioned coolant loop within the electronics subsystem, in accordance with an aspect of the present invention.

FIG. 3 depicts one embodiment of a cooling system accomplishing this objective. This cooling system or apparatus includes a coolant distribution unit 100 and one or more thermal dissipation units 195. Each thermal dissipation unit 195 is associated with a respective electronics subsystem or drawer 135 of an electronics rack 130 of the computing environment. The coolant distribution unit 100 again includes a first heat exchanger 114, a first cooling loop 116, 117, and one or more second cooling loops 122, 123. The first cooling loop 116, 117 receives facility coolant and passes at least a portion thereof through the first heat exchanger 114. Each second cooling loop provides system coolant to at least one electronics subsystem 135 and expels heat in the first heat exchanger 114 from electronics subsystem 135 to the facility coolant in the first cooling loop 116, 117. System coolant is circulated within the second cooling loop 122, 123 via a pump 115.

Each thermal dissipation unit 195 is associated with a respective electronics subsystem 135, and includes a second heat exchanger 160, a second cooling loop 122, 123 of the one or more second cooling loops, a third cooling loop 170, and a micro-scaled cooling structure 180. The second cooling loop provides system coolant to the second heat exchanger 160, and the third cooling loop circulates conditioned coolant within the at least one electronics subsystem through the micro-scaled cooling structure 180 and expels heat in the second heat exchanger 160 from a heat generating component 190 (e.g., electronics module) of the electronics subsystem 135. The heat is expelled in the heat exchanger to the system coolant in the second cooling loop 122, 123. Conditioned coolant circulates via a pump 175 through the third cooling loop 170 of the thermal dissipation unit 195. One example of a suitable pump 175 is provided in the initially incorporated, commonly assigned application entitled: "Cooling Apparatus For An Electronics Subsystem Employing A Coolant Flow Drive Apparatus Between Coolant Flow Paths". In one example, the third cooling loop is a closed loop fluid path, thereby minimizing the opportunity for particulate to enter the cooling loop once the conditioned coolant has been filtered as described below.

Advantageously, the third cooling loop is physically isolated from the system coolant of the cooling assembly. The third cooling loop is a separate, dedicated loop or subassembly localized to the electronics subsystem, and to more particularly, the one or more heat generating components, such as an electronic module thereof, that is to be cooled. The third cooling loop and associated components comprise a subassembly that is manufactured to create a pristine environment from both a particulate and materials compatibility (i.e., corrosion) viewpoint. The cooling subassembly 195 is designed to be a closed system once operational (i.e., a system that is not opened in the field). Being a closed subsystem in the field, particulate contamination can be managed during assembly.

Figure 4A:
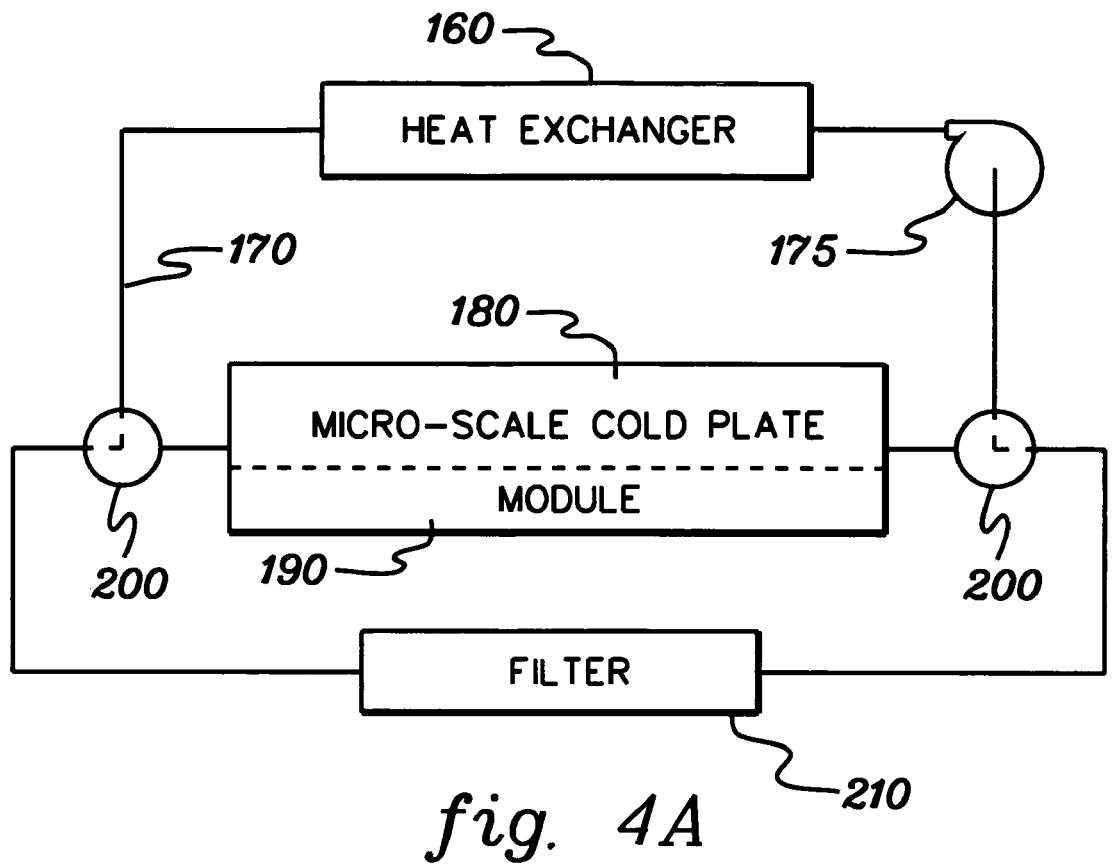
FIG. 4A depicts one embodiment of a method of filtering conditioned coolant within the conditioned coolant loop of the cooling system of FIG. 3, in accordance with an aspect of the present invention.
Figure 4B:
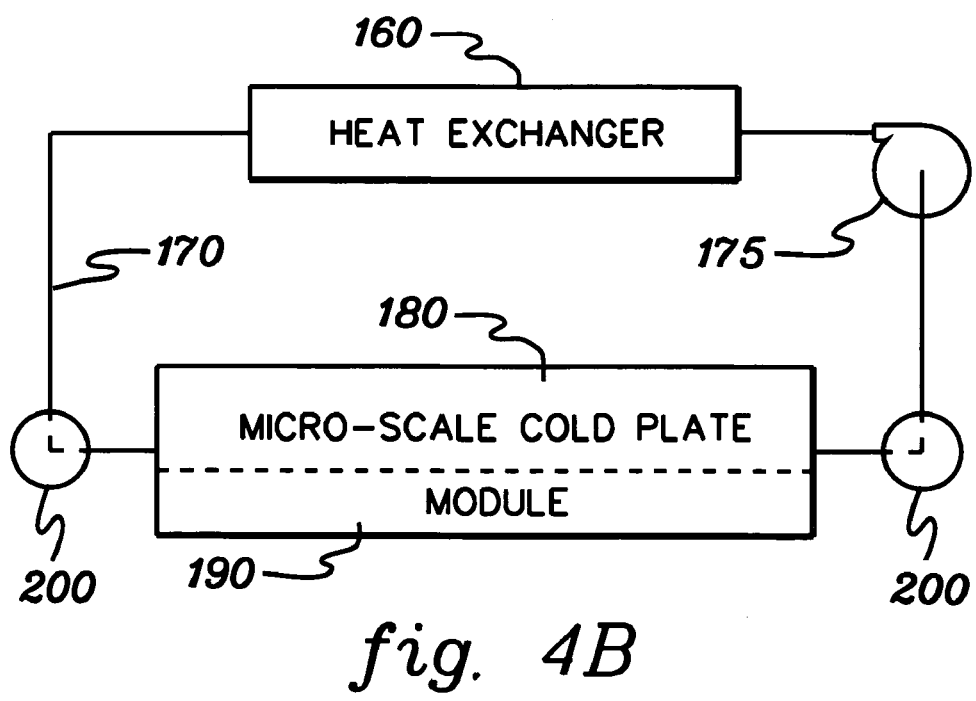
FIG. 4B depicts one embodiment of the thermal dissipation unit components of FIG. 4A, shown coupled to an electronics module to be cooled, in accordance with an aspect of the present invention.
Figure 5A:
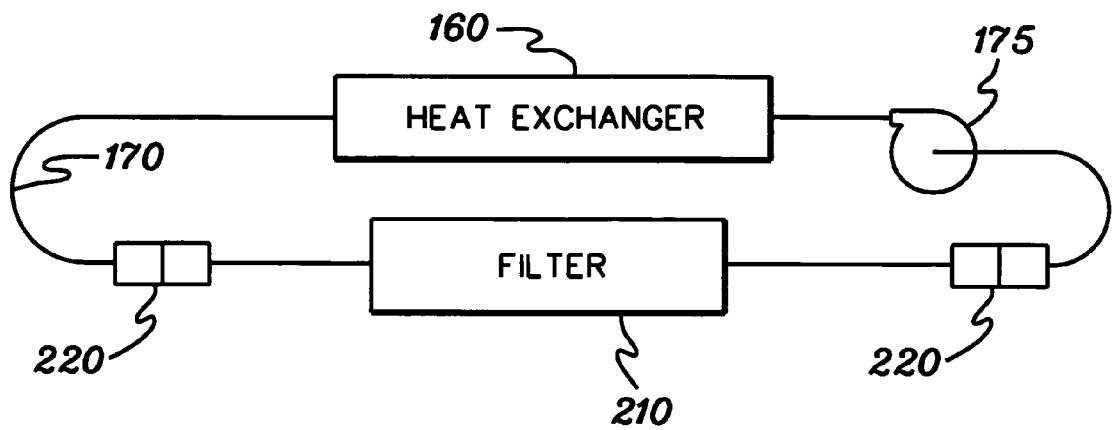
FIG. 5A depicts an alternate embodiment of a method of filtering conditioned coolant within the conditioned coolant loop of the cooling system of FIG. 3, in accordance with an aspect of the present invention.

FIGS. 4A & 5A depict alternate assemblies for filtering conditioned coolant within the thermal dissipation unit, for example, during fabrication of the unit. In FIG. 4A, the system subassembly 195 of FIG. 3 is shown associated with an electronics module 190, which may be integrated with or coupled to the micro-scaled cooling structure 180. The subassembly includes two three-way valves 200, which are opened in this example to allow coolant flow through a filter 210 rather than through the micro-scaled cooling structure 180. The conditioned coolant pumped 175 through the heat exchanger, the third cooling loop 170 and filter 210 via the three-way valves 200, is purified to a desired level for a particular application. Note that filter 210 can be any filtering mechanism designed to cleanse the conditioned coolant flowing through the third cooling loop 170 in a desired manner, and may include particulate filtering (resulting, e.g., from the manufacturing and assembly process), as well as chemical filtering (e.g., to remove undesired corrosive components from the coolant). Once filtered, valves 200 are either manually or automatically adjusted to remove filter 210 from the third cooling loop 170, thereby allowing the conditioned coolant to flow through the micro-scaled cooling structure 180 and heat exchanger 160 by means of pump 175 (see FIG. 4B).

FIG. 5A depicts an alternate method for filtering conditioned coolant within loop 170 of the cooling subassembly 195 of FIG. 3. In this embodiment, connect/disconnect couplings 220 are employed to connect a filter 210 to the third cooling loop 170. Filter 210 can again comprise any filtering mechanism for removing, for example, undesirable particulate and chemical components from the conditioned coolant flowing through the third cooling loop 170. Coolant is pumped 175 through the heat exchanger 160, the third cooling loop 170 and filter 210 for a sufficient period of time to achieve the desired level of coolant purity.

Figure 5B:
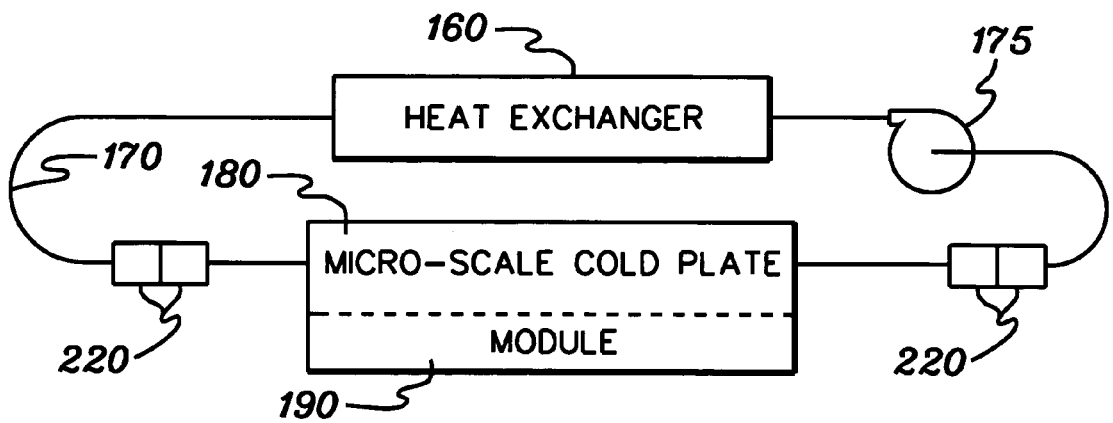
FIG. 5B depicts one embodiment of the thermal dissipation unit components after filtering of the conditioned coolant, and shown coupled to an electronics module to be cooled, in accordance with an aspect of the present invention.
Figure 6A:
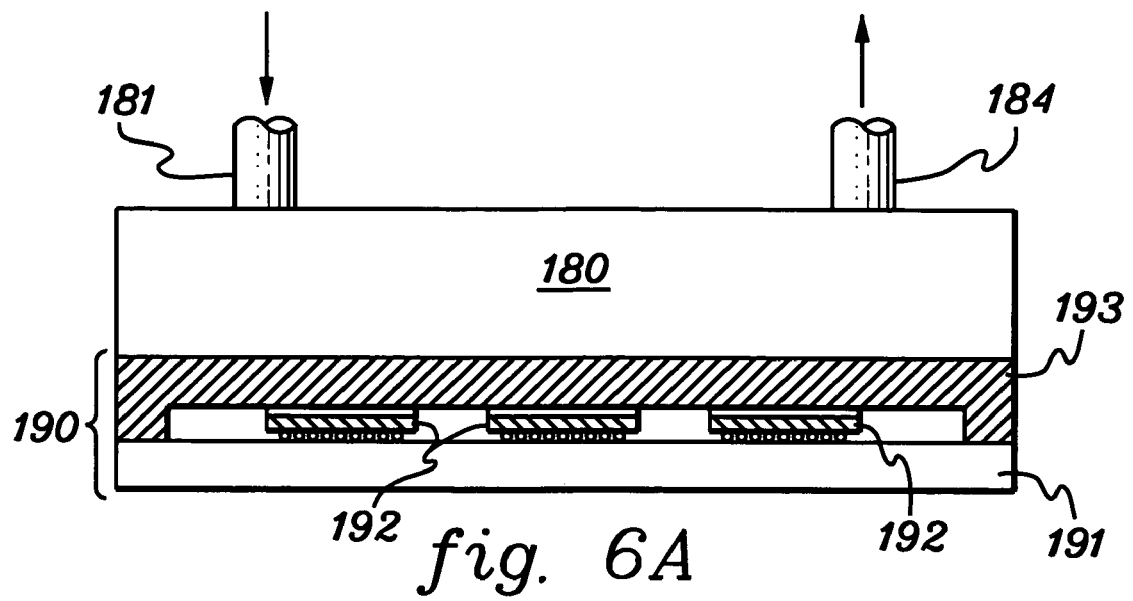
FIG. 6A is a cross-sectional elevational view of one embodiment of a micro-scaled cooling structure coupled to an electronics module for indirect expelling of heat from the integrated circuit chips of the module to conditioned coolant within the micro-scaled cooling structure, in accordance with an aspect of the present invention.
Figure 6B:
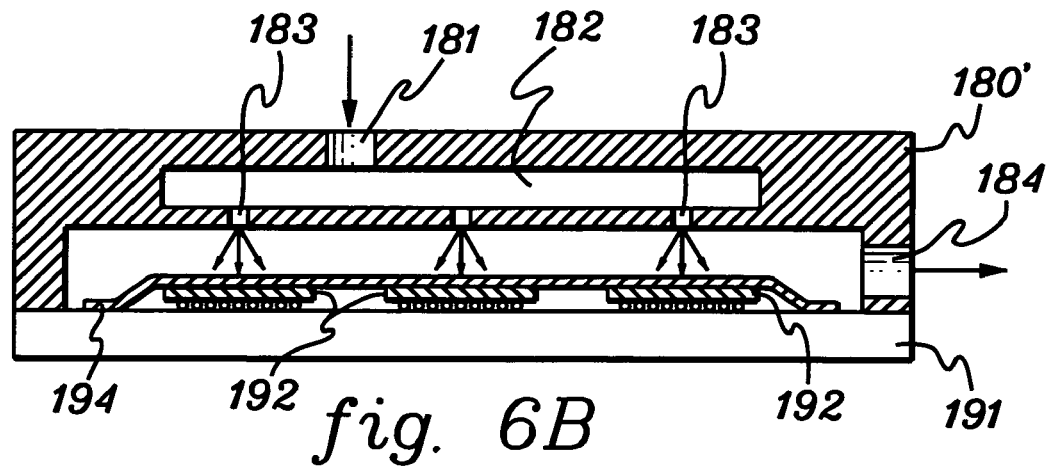
FIG. 6B is a cross-sectional elevational view of an alternate embodiment of a micro-scaled cooling structure coupled to a substrate having a plurality of integrated circuit chips thereon, with conditioned coolant being separated from the integrated circuit chips by an impermeable barrier layer, in accordance with an aspect of the present invention.
Figure 6C:
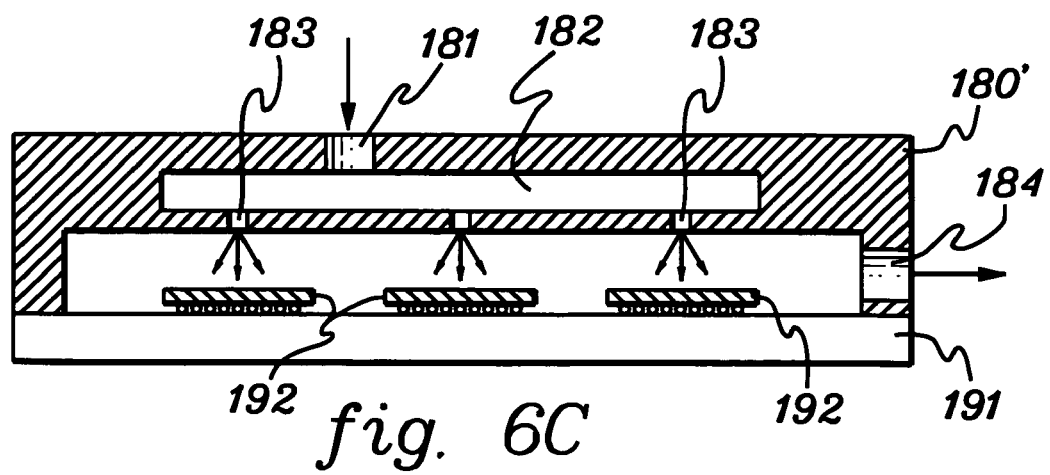
FIG. 6C is a cross-sectional elevational view of another embodiment of a micro-scaled cooling structure coupled to a substrate having a plurality of integrated circuit chips thereon, wherein the integrated circuit chips are cooled by direct conditioned coolant immersion, in accordance with an aspect of the present invention.

As shown in FIG. 5B, after the conditioned coolant has been appropriately filtered, filter 210 is removed and the micro-scaled cooling structure 180 is inserted into the third cooling loop, again using the couplings 220. In the embodiment shown, an electronic module 190 is assumed to be integrated with or coupled to the micro-scaled cooling structure 180. Various embodiments for coupling structure 180 to an electronic module are depicted in FIGS. 6A-6C and discussed further below.

Those skilled in the art will note that provided herein is a cooling assembly which employs three distinct cooling loops. A first, facility cooling loop and a second, system cooling loop are associated with a coolant distribution unit which includes a fluid-to-fluid heat exchanger to allow the transfer of heat from system coolant within the second cooling loop to facility coolant within the first cooling loop. One or more thermal dissipation units or cooling subassemblies are associated with one or more electronics subsystems of, for example, an electronics rack. Each thermal dissipation unit includes a respective second, system cooling loop and a third, conditioned cooling loop, which in one example, comprises an isolated, closed loop flow path. The thermal dissipation unit further includes a second fluid-to-fluid heat exchanger which allows heat to be expelled from conditioned coolant within the third, conditioned cooling loop to the system coolant within the second, system cooling loop for transfer to the coolant distribution unit. Advantageously, by separating the conditioned coolant, system coolant and facility coolant, each coolant loop can have coolant of different properties or characteristics. These different characteristics can include different:

Coolant purity—which allows the use of higher purity coolant within the third cooling loop, less pure coolant within the system coolant loop, and still less pure coolant within the facility coolant loop. High purity coolant is desirable in the third cooling loop of the thermal dissipation unit, particularly when used with small-scale cooling structures (i.e., channels, nozzles, orifices, etc.) to prevent contaminants from interfering with operation of, for example, a micro-scaled cooling structure.

Coolant pressure—which allows, for example, conditioned coolant within the third cooling loop to be at a pressure below atmospheric pressure, while system coolant and facility coolant in the second cooling loop and the first cooling loop remain at or above atmospheric pressure. This allows, for example, the conditioned coolant to have a different boiling point than the system coolant.

Coolant phase change—the third cooling loop allows a conditioned coolant to be employed in a two-phase cooling approach, while maintaining the system coolant and facility coolant as single-phase coolants.

Coolant flow rate—which may be related to different pressures and phase change temperatures of the various coolants in the cooling system. Further, it may be desirable to employ a lower flow rate through the micro-scaled cooling structure than the flow rate through, for example, the second cooling loop containing the system coolant.

Coolant chemistry—which allows different coolant fluid chemistries to be employed in the various cooling loops of the cooling system. For example, water could be employed in the first and second cooling loops as both the facility coolant and the system coolant, only of different purity, while the third cooling loop may employ a dielectric as the conditioned coolant. This may be advantageous, for example, in an embodiment where the conditioned coolant directly contacts one or more integrated circuit chips of the electronics subsystem being cooled.

As noted, FIGS. 6A-6C depict various embodiments for coupling a micro-scaled cooling structure 180 to one or more heat generating components of an electronics subsystem. In FIG. 6A, an electronic module 190 includes a substrate 191 having multiple integrated circuit chips 192 disposed thereon. A module lid 193 encases the integrated circuit chips within the module 190. Module 190 is shown mechanically coupled to a micro-scaled cooling structure 180 through which conditioned coolant (not shown) flows via an inlet 181 and outlet 184. Module lid 193 and micro-scaled cooling structure 180 are fabricated of materials appropriate for facilitating thermal transfer from integrated circuit chips 192 to the conditioned coolant flowing through the micro-scaled structure. As one enhancement, the micro-scaled cooling structure 180 may be part of a thermal dissipation unit which is a field replaceable unit. In such a case, connect/disconnect couplings may be employed in the second cooling loop to couple the system coolant to the newly replaced thermal dissipation unit without requiring opening of the third cooling loop containing the conditioned coolant flowing through the micro-scaled cooling structure 180.

FIG. 6B depicts an alternate embodiment of a micro-scaled cooling structure coupled to a chip assembly, which is referred to herein as near-direct coolant immersion. In this embodiment, cooling structure 180' couples to a substrate 191 having multiple integrated circuit chips 192 thereon. A multi-layer impermeable barrier 194 resides over the integrated circuit chips and protects the chips from the conditioned coolant flowing through the micro-scaled cooling structure 180'. Conditioned coolant flows onto the impermeable barrier 194 via micro-scaled orifices 183 in fluid communication with a supply manifold 182 receiving conditioned coolant via an inlet 181. Conditioned coolant flows from the integrated assembly via an outlet 184 in the micro-scaled cooling structure 180'. With this embodiment, any type of coolant may be employed, with water being one example. Advantageously, liquid is in near-direct contact with the integrated circuit chips, but remains isolated therefrom. Examples of near-direct integrated cooling structure and module assemblies are described in greater detail in commonly assigned U.S. Pat. No. 6,587,345 entitled "Electronic Device Substrate Assembly With Impermeable Barrier And Method Of Making" and U.S. patent application No. 2004/0012914 A1, entitled "Electronic Device Substrate Assembly With Multilayer Impermeable Barrier And Method Of Making", both of which are hereby incorporated herein by reference in their entirety.

FIG. 6C depicts still another attachment embodiment for integrating a micro-scaled cooling structure with an integrated circuit assembly. This embodiment is referred to as direct coolant immersion since the conditioned coolant impinges directly onto the multiple integrated circuit chips 192 disposed on substrate 191. As shown, the micro-scaled cooling structure 180' again includes micro-scale orifices 183 which provide conditioned coolant from a supply manifold 182 in fluid communication with an inlet 181 coupled to the third cooling loop of the respective thermal dissipation unit. The micro-scaled cooling structure 180' in FIG. 6C includes an outlet 184, which is in fluid communication with the third cooling loop 170 of the thermal dissipation unit 195 of, for example, FIG. 3. With direct coolant immersion, the substrate and the cooling assembly are an integrated unit, and no fluid barrier exists between the conditioned coolant and the integrated circuit chips. This is possible by using a dielectric coolant selected so as not to damage the integrated circuit chips. A more detailed discussion of an integrated micro-scaled cooling structure and circuit subassembly is provided in the initially incorporated, commonly assigned application entitled: "Cooling Apparatus And Method For An Electronics Module Employing An Integrated Heat Exchange Assembly".

FIGS. 7-15 depict various embodiments of a heat exchange assembly, in accordance with aspects of the present invention, and which can be employed, for example, as the second fluid-to-fluid heat exchanger of the thermal dissipation unit in a cooling system such as described above. When so employed, the heat exchange assembly allows heat to be expelled from the conditioned coolant within the third, conditioned cooling loop to the system coolant within the second, system coolant loop for transfer to the coolant distribution unit (see FIG. 3). One consequence of such a cooling system is that coolant flowing in the third, conditioned cooling loop localized to the electronic subassembly (i.e., the conditioned cooling loop having the conditioned coolant flowing through the micro-scaled cooling structure) will be higher in temperature than the system coolant flowing in the respective second, system cooling loop. This temperature difference between the conditioned coolant and the system coolant constitutes a temperature penalty for a cooling system such as described herein, and must be minimized. To accomplish this objective, it is desirable that the second coolant-to-coolant heat exchange be as effective as possible in transferring heat from the conditioned coolant within the third, conditioned cooling loop to the system coolant within the second, system cooling loop. It is also desirable that the heat exchange assembly be as small as possible.

Figure 7:
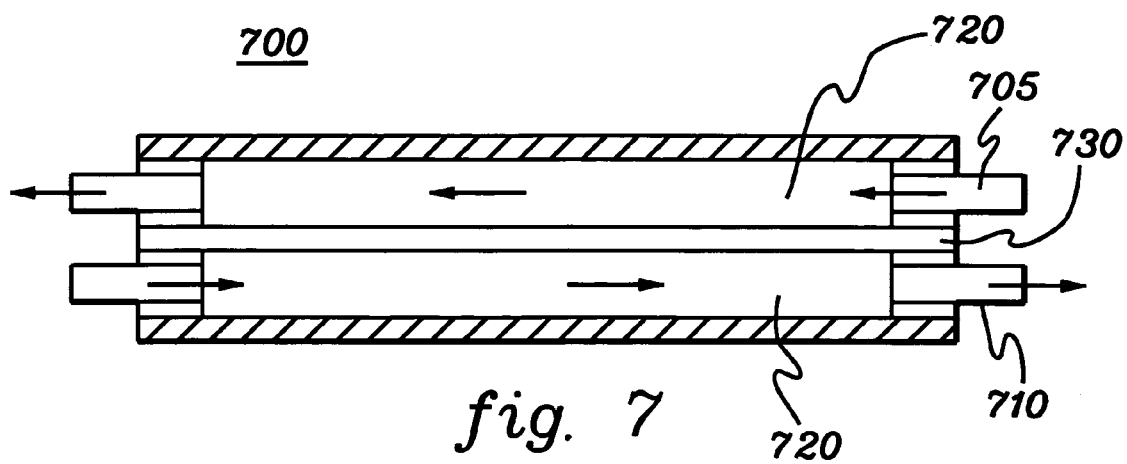
FIG. 7 is a cross-sectional elevational view of one embodiment of a planar heat exchanger capable of being used within a cooling system, in accordance with an aspect of the present invention.

As shown in FIG. 7, one heat exchange approach which could be employed within a cooling system such as described herein is a double-sided cold plate 700 with separate cooling passages 705, 710 and fins 720 providing heat transfer surfaces on opposing sides of a common center plate 730. In this embodiment, the conditioned coolant within the third conditioned cooling loop (i.e., the coolant flowing through the micro-scaled cooling structure), is circulated through coolant passages 710 on one side of the heat exchange assembly, while the system coolant in the respective second, system cooling loop is circulated through flow passages 705 on the opposite side of the heat exchanger 700. While such a cold plate heat exchanger as depicted in FIG. 7 could function, it would not provide the effectiveness and scalability desired in many applications.

Disclosed in FIGS. 8-15 are various embodiments of an enhanced heat exchange assembly, which is particularly beneficial for use as the second fluid-to-fluid heat exchanger in the cooling system of FIGS. 3-6C, although the heat exchange assembly is not limited to such a cooling system application.

Figure 8:
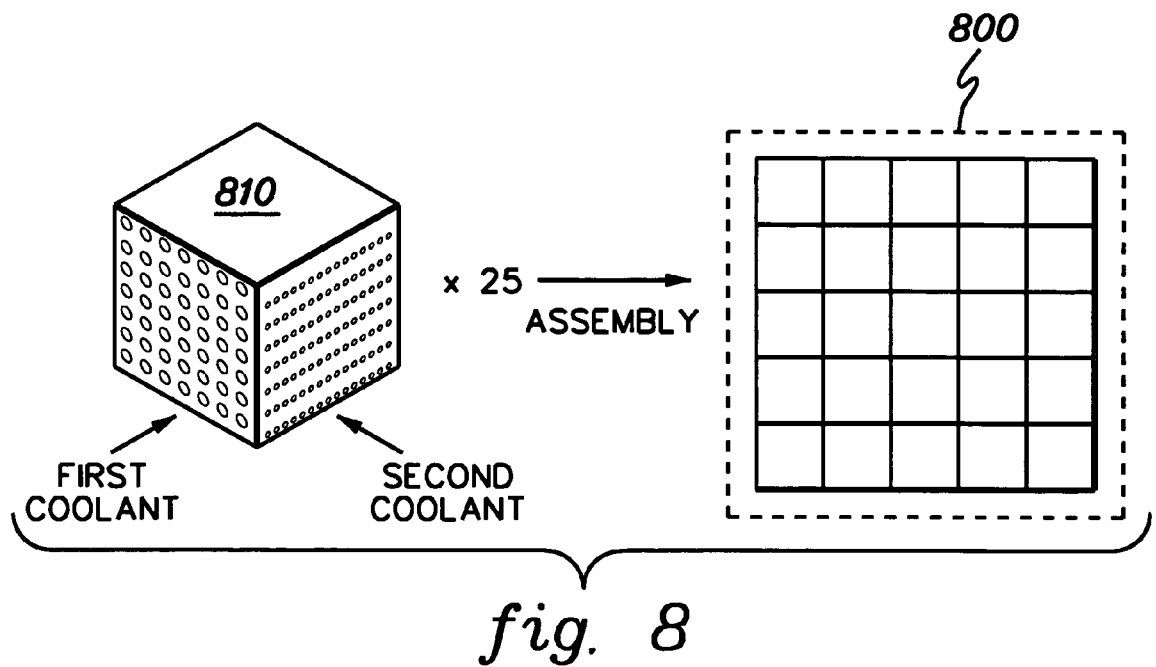
FIG. 8 is a depiction of one embodiment of a heat exchange element for a heat exchange assembly of a cooling system, and the disposition of multiple heat exchange elements in a 5×5 array within a heat exchange assembly, in accordance with an aspect of the present invention.

FIG. 8 depicts one embodiment of a modular heat exchange assembly in accordance with an aspect of the present invention. This heat exchange assembly, generally denoted 800, includes multiple heat exchange elements 810. In the depicted embodiment, there is a 5×5 array of heat exchange elements 810 arranged in a common plane within heat exchange assembly 800. It should be noted that the concepts provided herein are not limited to such a 5×5 configuration, however. Rather, the modularity of the heat exchange assembly allows the heat exchange assembly to be readily configured and scaled to any desired application. For example, the heat exchange assembly could comprise any n×n×1 arranged array of heat exchange elements, or even any n×m×j arrangement of heat exchange elements.

As a specific example, each heat exchange element could comprise a cubic heat exchange element approximately 25 mm×25 mm×25 mm in size as a basic building block for the fluid-to-fluid heat exchange assembly. Each heat exchange element has a first set of coolant flow passages, for example, drilled through a first pair of parallel face surfaces of the heat exchange element, and a second set of coolant flow passages drilled through a second pair of parallel face surfaces of the heat exchange element at levels or planes in between (i.e., interdigitated with) the levels or planes of the first set of coolant flow passages defined in the heat exchange element. In one embodiment, the heat exchange element thus formed is a monolithic, cross-flow heat exchanger through which first and second cooling streams are passed.

In the application of FIGS. 3-6C, the first cooling stream might comprise, for example, the system coolant within the respective second, system cooling loop, while the second cooling stream would be the conditioned coolant in the third, conditioned cooling loop of the cooling system. In one embodiment, the flow rate in the third, conditioned cooling loop having the conditioned coolant passing through the micro-scaled cooling structure may be lower than the flow rate of system coolant through the respective second, system cooling loop.

When assembled into a heat exchange assembly such as depicted in FIG. 8, the first set of coolant flow passages of the heat exchange elements are oriented in a first common direction, and the second set of coolant flow passages of the heat exchange elements are oriented in a second common direction. In the illustrated implementation, these sets of flow passages are transverse and orthogonal to each other. Optimal heat transfer characteristics are obtained by orienting the first set of coolant flow passages transverse to the second set of coolant flow passages.

An analysis has been performed comparing the temperature penalty associated with a double-sided cold plate heat exchange design such as illustrated in FIG. 7 with a multi-element heat exchange assembly such as illustrated in FIG. 8. For the cases examined, the multi-element heat exchange assembly resulted in a substantial reduction in the temperature penalty associated with having the second fluid-to-fluid heat exchanger (for example, an approximately one-half reduction in the temperature penalty was achieved), along with a substantially reduced pressure drop through the heat exchanger.

Figure 9:
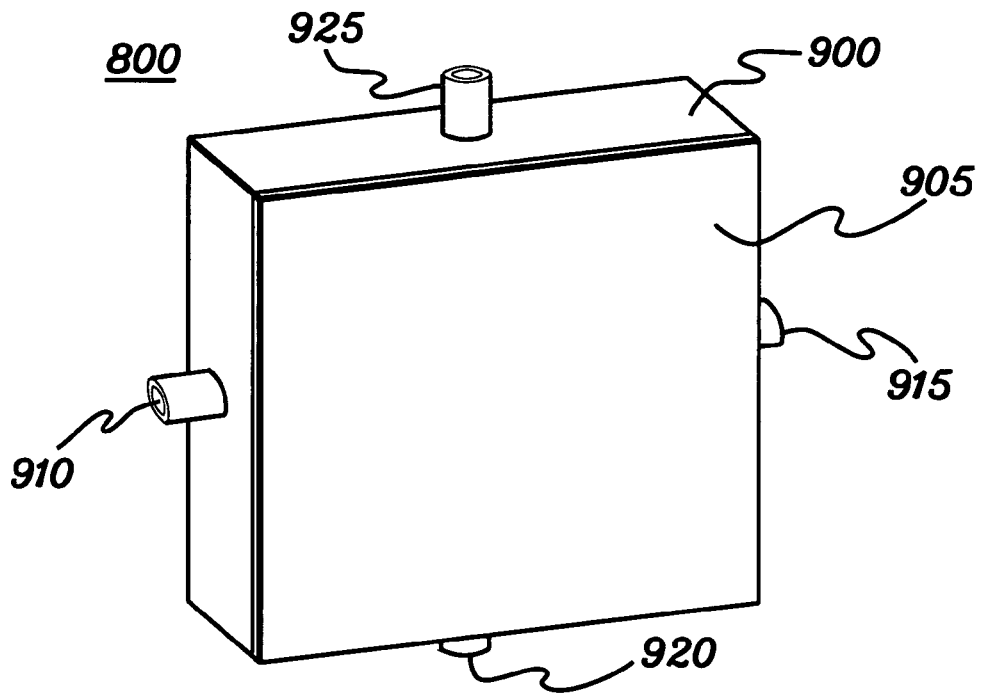
FIG. 9 is an isometric view of one embodiment of an assembled heat exchange assembly, in accordance with an aspect of the present invention.

FIG. 9 depicts one embodiment of an assembled heat exchange assembly, generally denoted 800, in accordance with the present invention. This heat exchange assembly 800 includes a base housing 900 and a cover plate 905. Base housing 900 has a first coolant inlet 910 and a first coolant outlet 915, which in the illustrated embodiment are disposed in two parallel face surfaces of base housing 900, and in one example, may be coaxial. Similarly, base housing 900 includes a second coolant inlet 920 and a second coolant outlet 925, again disposed in two different parallel face surfaces of base housing 900, and may be coaxial as shown. The first coolant inlet 910 and first coolant outlet 915 are designed to be in fluid communication with a first cooling loop of the cooling system employing the heat exchange assembly (e.g., the respective second, system cooling loop through a cooling system such as depicted in FIGS. 3-6C), while the second coolant inlet 920 and second coolant outlet 925 are designed to be in fluid communication with a second cooling loop coupled to the heat exchange assembly (such as the third, conditioned cooling loop of the cooling system of FIGS. 3-6C).

Although described herein with reference to the particular cooling system of FIGS. 3-6C, those skilled in the art will note that the heat exchange assembly presented can be employed with any cooling system wherein a fluid-to-fluid heat exchanger is desired. Although not shown, the heat exchange assembly presented herein could be disposed separate from a heat generating component to be cooled, e.g., utilizing a micro-scaled cooling structure coupled to the component, or the heat exchange assembly could itself be coupled to the heat generating component and the cooling structure as desired.

Figure 10:
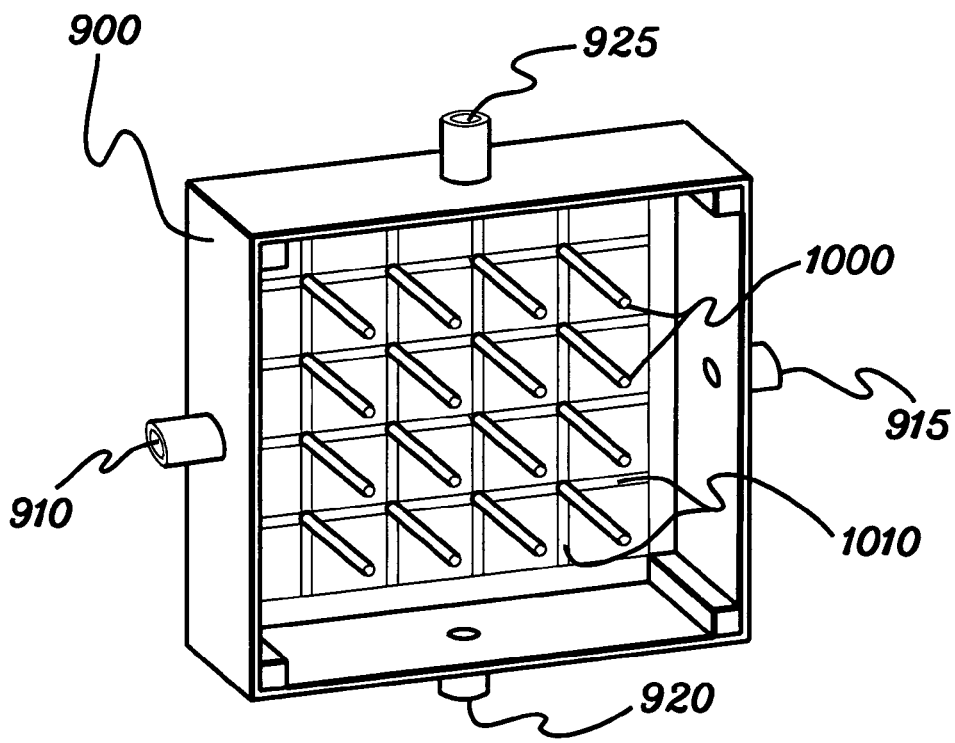
FIG. 10 is an isometric view of one embodiment of a base housing of the heat exchange assembly of FIG. 9, in accordance with an aspect of the present invention.

FIG. 10 illustrates one further example of base housing 900. In addition to having the above-noted first coolant inlet 910, first coolant outlet 915, second coolant inlet 920, and second coolant outlet 925, this base housing includes a plurality of positioning pins 1000 protruding from an inner base surface of housing 900. These positioning pins 1000 are disposed at the intersection points of an actual or imaginary grid 1010 sized and oriented to receive an n×n array of heat exchange elements. In one implementation, the individual positioning pins 1000 may be cruciform in cross-section, providing channels to locate the individual heat exchange elements within the assembly. The pins 1000 can be pre-tinned with solder or braze so that when the heat exchange elements have been positioned in the housing, the heat exchange assembly can be heated to reflow temperature, thereby soldering or brazing the heat exchange elements in place, and providing barriers to isolate the coolant flow streams between the first inlet and outlet ports and the second inlet and outlet ports.

FIG. 11 depicts an isometric view of one heat exchange element 810, in accordance with an aspect of the present invention. In this embodiment, element 810 is a monolithic structure, fabricated of a metal such as copper, and is cubic in shape. However, the element could readily be formed with any rectangular shape. In the embodiment shown, a first set of flow passages 1100 are disposed in multiple rows and extend through heat exchange element 810 from a first face surface to a parallel face surface thereof. Similarly, a second set of flow passages 1110 are disposed in multiple rows and extend from another face surface of the heat exchange element to a parallel face surface thereof. As shown, the first pair of face surfaces and the second pair of face surfaces are orthogonal to each other, and the first set of coolant flow passages and the second set of coolant flow passages are also transverse and orthogonal to each other. Further, the rows of flow passages of the first set of coolant flow passages are shown in interleaved planes in the monolithic structure with the rows of flow passages of the second set of coolant flow passages.

FIGS. 12A-12C illustrate a single heat exchange element 810 being placed into position between positioning/isolation pins 1000 extending from a base of housing 900. The positioning pins are located at each corner of a cell within the base housing which the heat exchange element occupies when assembled. As noted, each positioning pin is cruciform in cross-section and is pre-tinned to form a solder or braze connection along each vertical and horizontal edge of a heat exchange element when heated, thereby establishing an intermediate coolant plenum between adjacent opposing face surfaces of adjacent heat exchange elements, and a barrier to prevent intermixing of the first and second coolant streams through the heat exchange assembly.

Figure 13:
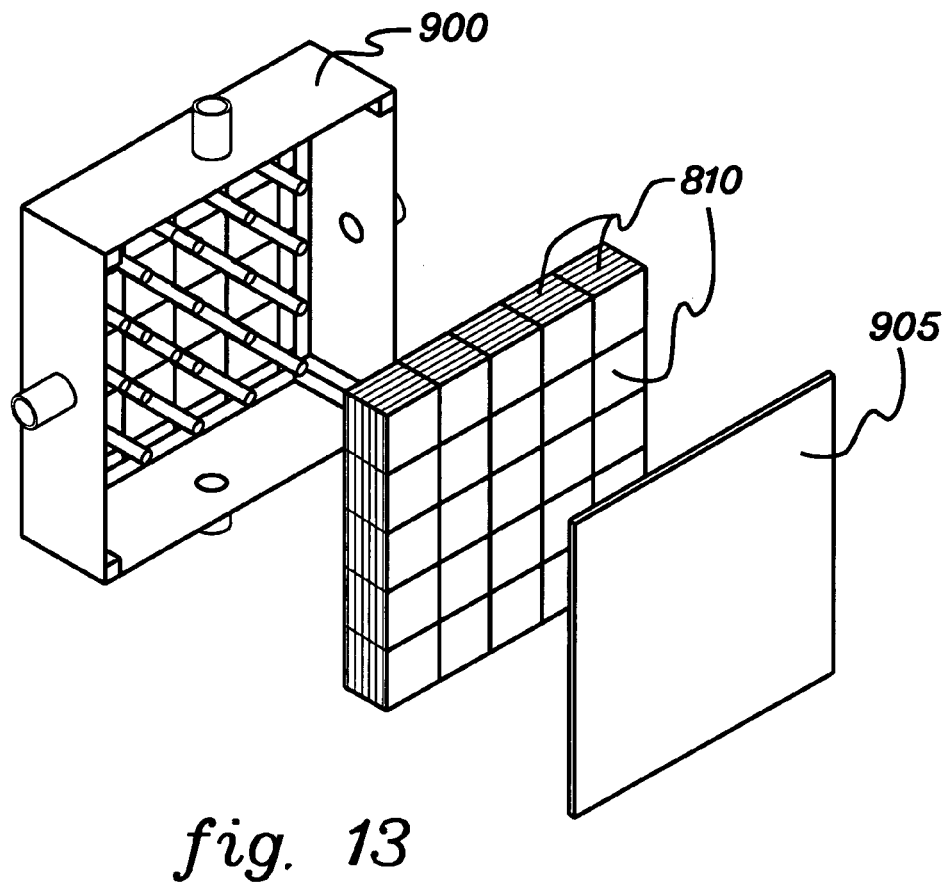
FIG. 13 is a partially exploded view of one embodiment of a heat exchange assembly, in accordance with an aspect of the present invention.

FIG. 13 illustrates a partially exploded view of a heat exchange assembly, in accordance with an aspect of the present invention. As shown, this assembly includes base housing 900, a 5×5 array of heat exchange elements 810, and a cover plate 905. Those skilled in the art will again note that the heat exchange assembly can be readily configured to accommodate any n×m×j array of heat exchange elements assembled in a manner described herein. The 5×5×1 array is shown for purposes of example only.

Figures 14A, 14B:
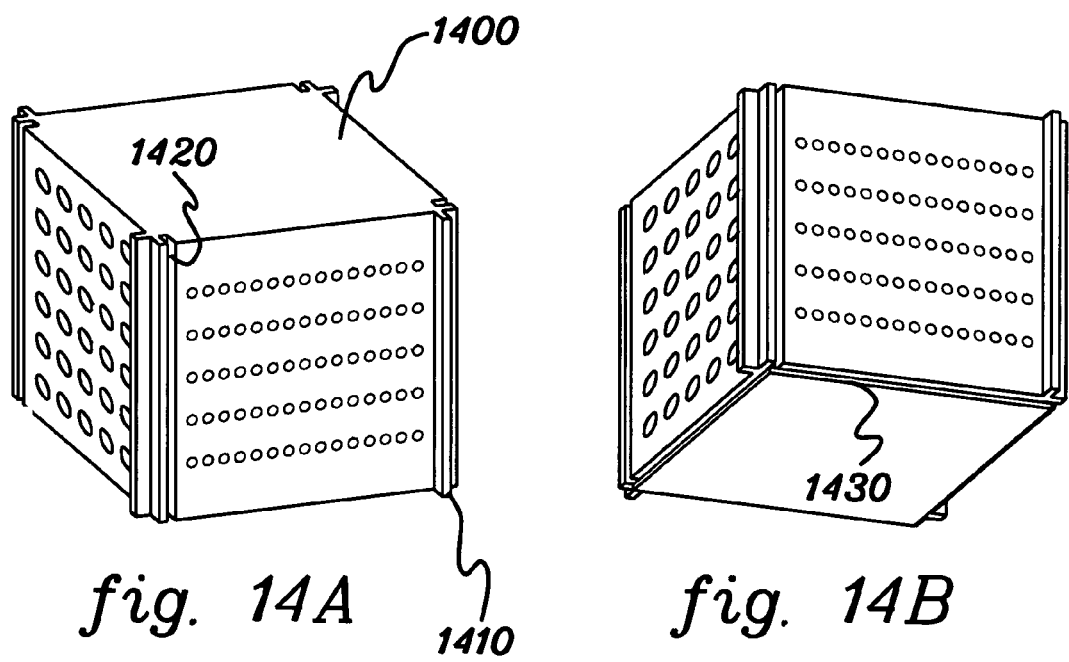
FIG. 14A is a top isometric view of an alternate embodiment of a heat exchange element for a heat exchange assembly, in accordance with an aspect of the present invention.
FIG. 14B is a bottom isometric view of the heat exchange element of FIG. 14A, in accordance with an aspect of the present invention.
Figure 15:
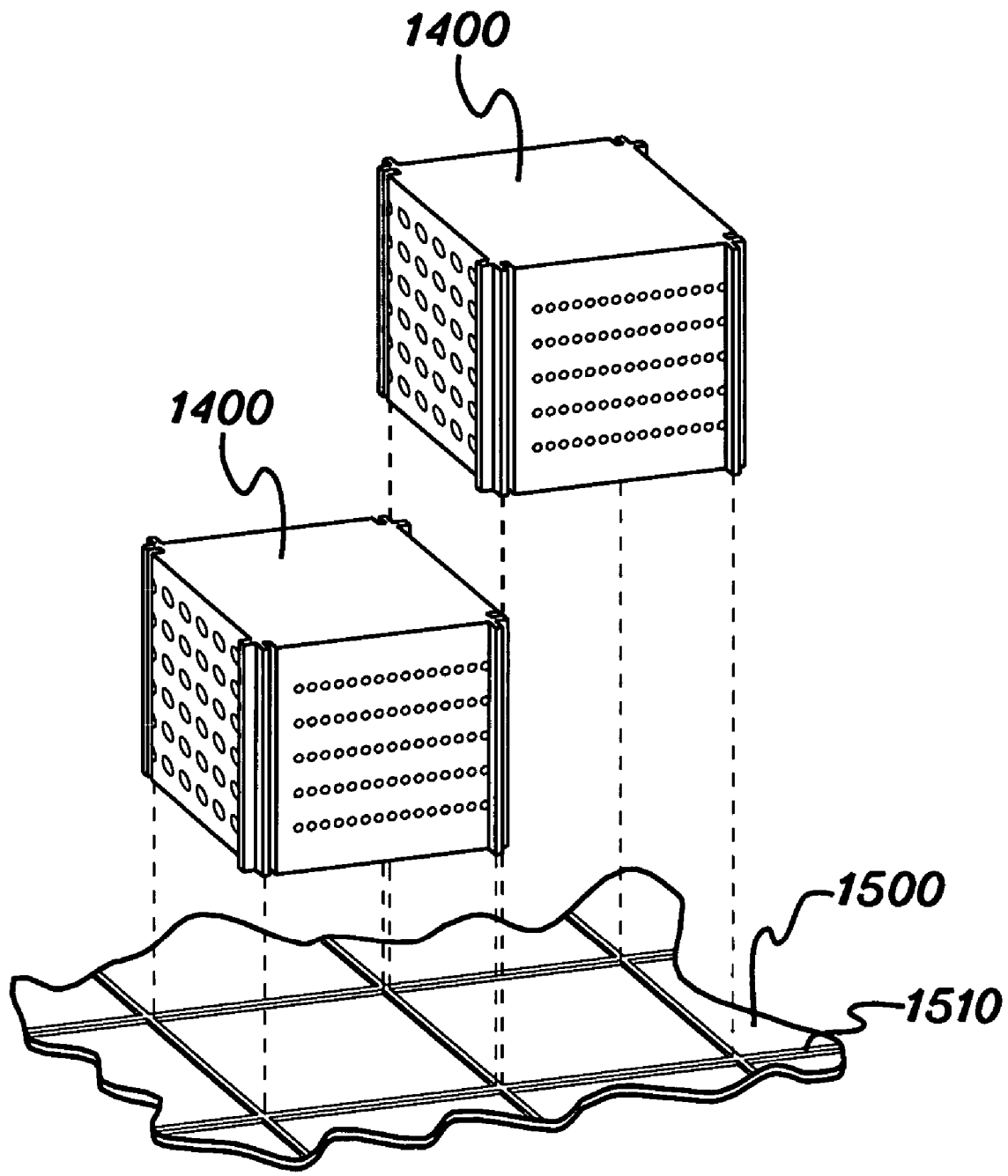
FIG. 15 is an isometric view of one embodiment of two adjacent heat exchange elements as depicted in FIGS. 14A & 14B, shown exploded above a base housing and indicating position of the elements relative to each other and relative to a relief structure of the base housing, in accordance with an aspect of the present invention.

FIGS. 14A & 14B depict an alternate embodiment of a heat exchange element, generally denoted 1400, in accordance with an aspect of the present invention. In this embodiment, each element is provided with a key 1410 and a corresponding keyway 1420 on each of the four face surfaces having the first set of coolant flow passages and second set of coolant flow passages extending therethrough. Each vertical oriented key 1410 is sized to reside within a vertically oriented keyway 1420 of an adjacent heat exchange element, and each vertically oriented key of the adjacent heat exchange element is sized and located to reside within the vertically oriented keyway of the first heat exchange element as shown in FIG. 15. Each heat exchange element further includes a base seat 1430 sized to position the element within a corresponding relief structure 1510 arrayed on base 1500 of the housing (see FIG. 15). The vertically extending key sections and keyways are each pre-tinned, as is the base seat at the bottom of the heat exchange element, and also a top seat (not shown) in cover 905 of FIGS. 9 & 13. Once assembled, the heat exchange assembly is heated to reflow the solder and seal the elements in place within the assembly.

FIG. 15 illustrates two adjacent heat exchange elements 1400 being placed into corresponding sections of base housing 1500 defined by relief structure 1510. The key sections and keyways allow the elements to be assembled in an interlocking manner, after which the entire assembly is heated to reflow the solder and form the heat exchange core, with the isolation of the first and second cooling streams established.

Those skilled in the art will note from the above description that the modular heat exchange elements being assembled and sealed as described herein results in thin coolant plenums between opposing faces of adjacent elements. By so fabricating the heat exchange core, there is no need for the first set of coolant flow passages of one element to perfectly align with the first set of coolant flow passages of each adjacent element, and similarly, there is no need for the second set of coolant flow passages of one element to perfectly align with the second set of coolant flow passages of the adjacent elements in the heat exchange core. This is particularly significant where flow passages of one or both of the sets of coolant flow passages have a characteristic diameter in the range of 200 microns or less. In the embodiment illustrated in FIGS. 8-15, the first set of coolant flow passages might comprise macro-scaled coolant flow passages (e.g., in the range of 1-5 millimeters), while the flow passages of the second set of coolant flow passages have a characteristic diameter in a micro-scale range (i.e., less than 200 microns each). These flow passages can be formed within a unitary block by EDM drilling the block from opposing parallel face surfaces.

Figure 16:
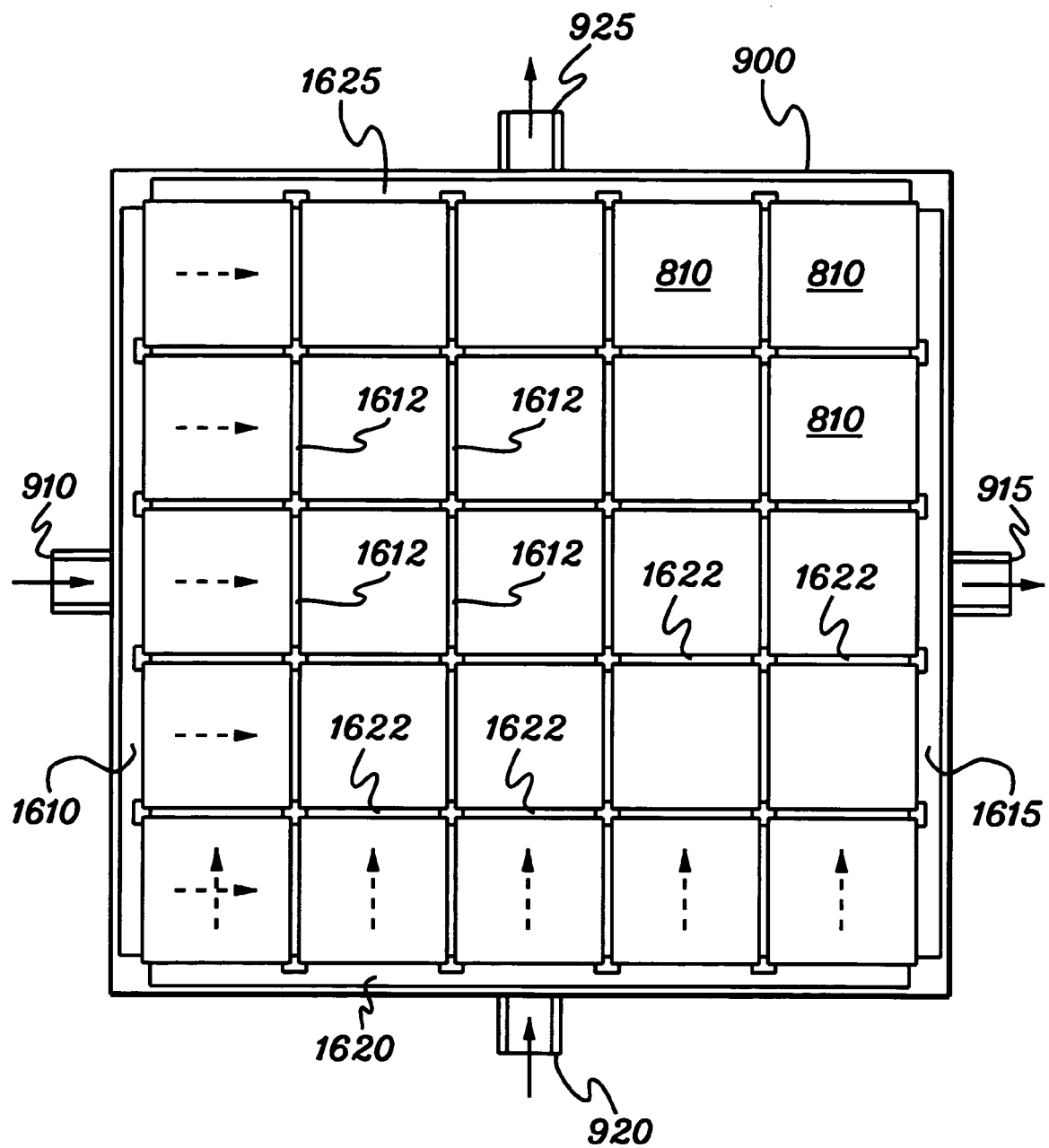
FIG. 16 is a cross-sectional view of one embodiment of an assembled heat exchange assembly, in accordance with an aspect of the present invention.

By way of further example, FIG. 16 illustrates a cross-sectional view of an assembled heat exchange assembly comprising a base housing 900 with a 5×5 array of heat exchange elements 810 positioned therein. Base housing 900 again includes a first coolant inlet 910, first coolant outlet 915, second coolant inlet 920 and second coolant outlet 925. The positioning pins position heat exchange elements 810, and define a first coolant inlet plenum 1610, a first coolant outlet plenum 1615, and first coolant intermediate plenums 1612 between adjacent opposing surfaces of adjacent heat exchange elements when traversing the assembly from first coolant inlet 910 to first coolant outlet 915 through the first set of coolant flow passages in elements 810. Similarly, a second coolant inlet plenum 1620, a second coolant outlet plenum 1625, and second coolant intermediate plenums 1622 are defined. These plenums are in fluid communication via the second set of coolant flow passages passing through the heat exchange elements 810.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A heat exchange assembly for a cooling system comprising a first cooling loop and a second cooling loop, the heat exchange assembly comprising:

a housing including a first coolant inlet, a first coolant outlet, a second coolant inlet and a second coolant outlet, the first coolant inlet and the first coolant outlet being designed to couple in fluid communication with the first cooling loop, and the second coolant inlet and the second coolant outlet being designed to couple in fluid communication with the second cooling loop; and multiple heat exchange elements disposed within the housing, each heat exchange element comprising a structure with a first set of coolant flow passages defined therein intersecting a first pair of parallel face surfaces of the structure and a second set of coolant flow passages defined therein intersecting a second pair of parallel face surfaces of the structure, wherein the second set of coolant flow passages extend in a transverse direction to the first set of coolant flow passages, and wherein the heat exchange elements are disposed within the housing with the first set of coolant flow passages thereof oriented in a first common direction in fluid communication with the first coolant inlet and the first coolant outlet of the housing, and the second set of coolant flow passages thereof oriented in a second common direction in fluid communication with the second coolant inlet and the second coolant outlet of the housing.

2. The heat exchange assembly of claim 1, wherein the multiple heat exchange elements each comprise a monolithic structure, and wherein for each heat exchange element, flow passages of the first set of coolant flow passages have a first minimum diameter and flow passages of the second set of coolant flow passages have a second minimum diameter, wherein the first minimum diameter is greater than the second minimum diameter.

3. The heat exchange assembly of claim 2, wherein each heat exchange element is one of a cubic monolithic structure or a rectangular monolithic structure, and wherein the multiple heat exchange elements are disposed in fixed relation within the housing, with opposing face surfaces of adjacent heat exchange elements in spaced relation to define at least one intermediate coolant plenum, and wherein each intermediate coolant plenum is in fluid communication with either the first set of coolant flow passages or the second set of coolant flow passages.

4. The heat exchange assembly of claim 3, wherein the housing further comprises positioning pins projecting from an inner base surface thereof, and wherein the positioning pins are spaced and sized to accommodate the multiple heat exchange elements therebetween, with at least one positioning pin being disposed adjacent to at least one corner of at least two heat exchange elements, and wherein fluid-tight seals exist between each positioning pin and its adjacent heat exchange elements.

5. The heat exchange assembly of claim 1, wherein each heat exchange element is configured with at least one of a key and a keyway on at least one surface thereof, the at least one key and keyway of one heat exchange element being sized, disposed, and shaped to mate with at least one corresponding keyway and key on at least one surface of an adjacent heat exchange element, wherein each key and corresponding keyway pair facilitates maintaining the heat exchange elements in a fixed array within the housing.

6. The heat exchange assembly of claim 5, wherein an inner base surface of the housing further includes a relief structure configured to receive and position the multiple heat exchange elements, and wherein each heat exchange element comprises a base seat sized to set the heat exchange element in fixed position relative to a portion of the relief structure within the housing.

7. The heat exchange assembly of claim 1, wherein for each heat exchange element, the first set of coolant flow passages are disposed within the structure in multiple first rows of multiple coolant flow passages, and wherein the second set of coolant flow passages are disposed within the structure in multiple second rows of multiple coolant flow passages.

8. The heat exchange assembly of claim 7, wherein for each heat exchange element, the multiple first rows of the first set of coolant flow passages and the multiple second rows of the second set of coolant flow passages are interdigitated within the structure, and wherein at least some rows of the multiple second rows of flow passages of the second set of coolant flow passages contain a larger number of flow passages than a number of flow passages in each first row of flow of passages of the first set of coolant flow passages, and wherein flow passages of the first set of coolant flow passages have a first minimum diameter and flow passages of the second set of coolant flow passages have a second minimum diameter, wherein the first minimum diameter is greater than the second minimum diameter.

9. A cooled electronics system comprising:
at least one electronics rack comprising a plurality of electronics subsystems; and
a cooling system for at least one electronics subsystem of the plurality of electronics subsystems of the at least one electronics rack, the cooling system comprising a first cooling loop and a second cooling loop coupled via a heat exchange assembly, the heat exchange assembly comprising:
a housing including a first coolant inlet, a first coolant outlet, a second coolant inlet and a second coolant outlet, the first coolant inlet and the first coolant outlet being coupled in fluid communication with the first cooling loop, and the second coolant inlet and the second coolant outlet being coupled in fluid communication with the second cooling loop; and
multiple heat exchange elements disposed within the housing, each heat exchange element comprising a structure with a first set of coolant flow passages defined therein intersecting a first pair of parallel face surfaces of the structure and a second set of coolant flow passages defined therein intersecting a second pair of parallel face surfaces of the structure, wherein the second set of coolant flow passages extend in a transverse direction to the first set of coolant flow passages, and wherein the heat exchange elements are disposed within the housing with the first set of coolant flow passages thereof oriented in a first common direction in fluid communication with the first coolant inlet and the first coolant outlet of the housing, and the second set of coolant flow passages thereof oriented in a second common direction in fluid communication with the second coolant inlet and the second coolant outlet of the housing.

10. The cooled electronics system of claim 9, wherein the multiple heat exchange elements each comprise a monolithic structure, and wherein for each heat exchange element, flow passages of the first set of coolant flow passages have a first minimum diameter and flow passages of the second set of coolant flow passages have a second minimum diameter, wherein the first minimum diameter is greater than the second minimum diameter.

11. The cooled electronics system of claim 10, wherein each heat exchange element is one of a cubic monolithic structure or a rectangular monolithic structure, and wherein the multiple heat exchange elements are disposed in fixed relation within the housing, with opposing face surfaces of adjacent heat exchange elements in spaced relation to define at least one intermediate coolant plenum, and wherein each intermediate coolant plenum is in fluid communication with either the first set of coolant flow passages or the second set of coolant flow passages.

12. The cooled electronics system of claim 11, wherein the housing further comprises positioning pins projecting from an inner base surface thereof, and wherein the positioning pins are spaced and sized to accommodate the multiple heat exchange elements therebetween, with at least one positioning pin being disposed adjacent to at least one corner of at least two heat exchange elements, and wherein fluid-tight seals exist between each positioning pin and its adjacent heat exchange elements.

13. The cooled electronics system of claim 9, wherein each heat exchange element is configured with at least one of a key and a keyway on at least one surface thereof, the at least one key and keyway of one heat exchange element being sized, disposed, and shaped to mate with at least one corresponding keyway and key on at least one surface of an adjacent heat exchange element, wherein each key and corresponding keyway pair facilitates maintaining the heat exchange elements in a fixed array within the housing.

14. The cooled electronics system of claim 13, wherein an inner base surface of the housing further includes a relief structure configured to receive and position the multiple heat exchange elements, and wherein each heat exchange element comprises a base seat sized to set the heat exchange element in fixed position relative to a portion of the relief structure within the housing.

15. The cooled electronics system of claim 9, wherein for each heat exchange element, the first set of coolant flow passages are disposed within the structure in multiple first rows of multiple coolant flow passages, and wherein the second set of coolant flow passages are disposed within the structure in multiple second rows of multiple coolant flow passages.

16. The cooled electronics system of claim 15, wherein for each heat exchange element, the multiple first rows of the first set of coolant flow passages and the multiple second rows of the second set of coolant flow passages are interdigitated within the structure, and wherein at least some rows of the multiple second rows of flow passages of the second set of coolant flow passages contain a larger number of flow passages than a number of flow passages in each first row of flow of passages of the first set of coolant flow passages, and wherein flow passages of the first set of coolant flow passages have a first minimum diameter and flow passages of the second set of coolant flow passages have a second minimum diameter, wherein the first minimum diameter is greater than the second minimum diameter.

17. A method of fabricating a heat exchange assembly for a cooling system comprising a first cooling loop and a second cooling loop, the method comprising:
providing a housing having a first coolant inlet, a first coolant outlet, a second coolant inlet and a second coolant outlet, the first coolant inlet and the first coolant outlet being provided for fluid communication with the first cooling loop, and the second coolant inlet and second coolant outlet being provided for fluid communication with the second cooling loop; and
disposing multiple heat exchange elements within the housing, each heat exchange element comprising a structure with a first set of coolant flow passages defined therein intersecting a first pair of parallel face surfaces of the structure and a second set of coolant flow passages defined therein intersecting a second pair of parallel face surfaces of the structure, wherein the second set of coolant flow passages extend in a transverse direction to the first set of coolant flow passages, and wherein the heat exchange elements are disposed within the housing with the first set of coolant flow passages thereof oriented in a first common direction between the first coolant inlet and the first coolant outlet of the housing, and the second set of coolant flow passages thereof oriented in a second common direction between the second coolant inlet and the second coolant outlet of the housing.

18. The method of claim 17, wherein each heat exchange element comprises a monolithic structure wherein flow passages of the first set of coolant flow passages have a first minimum diameter and flow passages of the second set of coolant flow passages have a second minimum diameter, wherein the first minimum diameter is greater than the second minimum diameter.

19. The method of claim 17, wherein the structure of each heat exchange element is one of a cubic monolithic structure or a rectangular monolithic structure, and wherein the disposing further comprises disposing the multiple heat exchange elements in fixed relation within the housing, with opposing face surfaces of adjacent heat exchange elements in spaced relation to define at least one intermediate coolant plenum, wherein each intermediate coolant plenum is in fluid communication with either the first set of coolant flow passages or the second set of coolant flow passages, and wherein the method further comprises forming a fluid-tight seal around each intermediate coolant plenum.

20. The method of claim 19, wherein the forming of the fluid-tight seal comprises pre-tinning at least one of a portion of the housing or the multiple heat exchange elements, and heating the heat exchange assembly to reflow the pre-tinning and form the fluid-tight seal around each intermediate coolant plenum defined between opposing face surfaces of adjacent heat exchange elements in spaced relation within the housing.

* * * * *